(12) United States Patent
Chen et al.

(10) Patent No.: US 9,478,457 B2
(45) Date of Patent: Oct. 25, 2016

(54) SHALLOW TRENCH ISOLATION STRUCTURES IN SEMICONDUCTOR DEVICE AND METHOD FOR MANUFACTURING THE SAME

(71) Applicant: UNITED MICROELECTRONICS CORPORATION, Hsinchu (TW)

(72) Inventors: Ming-Shing Chen, Tainan (TW); Yu-Ting Wang, Tainan (TW); Ming-Hui Chang, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/957,585

(22) Filed: Dec. 2, 2015

(65) Prior Publication Data
US 2016/0086843 A1 Mar. 24, 2016

Related U.S. Application Data

(62) Division of application No. 14/457,119, filed on Aug. 12, 2014, now Pat. No. 9,236,289.

(51) Int. Cl.
*H01L 21/762* (2006.01)

(52) U.S. Cl.
CPC ... *H01L 21/76229* (2013.01); *H01L 21/76224* (2013.01)

(58) Field of Classification Search
CPC ........... H01L 21/762; H01L 21/76229; H01L 21/32; H01L 21/3105; H01L 21/31055; H01L 21/76224; H01L 21/28194; H01L 21/823842; H01L 21/28088; H01L 21/28079
USPC ............... 438/424, 426, 427, 259, 270, 692
See application file for complete search history.

(56) References Cited

U.S. PATENT DOCUMENTS

| | | |
|---|---|---|
| 5,433,794 A | 7/1995 | Fazan |
| 5,747,866 A | 5/1998 | Ho |
| 6,054,343 A | 4/2000 | Ashburn |
| 6,204,146 B1 | 3/2001 | Jenq |
| 8,530,327 B2 | 9/2013 | Piper |
| 2008/0283962 A1* | 11/2008 | Dyer ............... H01L 21/3086 257/513 |
| 2010/0032773 A1* | 2/2010 | Shrivastava ...... H01L 29/0653 257/408 |
| 2013/0034949 A1 | 2/2013 | Kao |
| 2013/0323903 A1* | 12/2013 | Fenouillet-Beranger ......... H01L 21/76224 438/424 |

OTHER PUBLICATIONS

Y.H. Liou, Y.S. Chen, C.S. Wu, C.S. Tsai, M.Chi, / Plasma Charging Damage on Silicon Surface during Reverse-AA Oxide Etching in Poly-Buffered I(PB-STI) Isolation Process / Plasma- and Process-Induced Damage, 2001 6th International Symposium on / May 13, 2001-May 15, 2001 / 33-35 / Taiwan.

* cited by examiner

*Primary Examiner* — Chuong A Luu
(74) *Attorney, Agent, or Firm* — Ding Yu Tan

(57) ABSTRACT

Shallow trench isolation structures in a semiconductor device and a method for manufacturing the same. The method includes steps hereinafter. A substrate is provided with a pad oxide layer and a first patterned photoresist layer thereon. A first trench is formed in the substrate corresponding to the first patterned photoresist layer. A first dielectric layer is deposited in the first trench and on the substrate. A second patterned photoresist layer is provided to form an opening in the first dielectric layer and a second trench in the substrate corresponding to the second patterned photoresist layer. A second dielectric layer is deposited to cover the first trench and the second trench in the substrate and the first dielectric layer on the substrate. The second dielectric layer is removed by chemical-mechanical polishing until the first dielectric layer is exposed. The first dielectric layer on the substrate is selectively removed.

11 Claims, 7 Drawing Sheets

SHALLOW TRENCH ISOLATION STRUCTURES IN SEMICONDUCTOR DEVICE AND METHOD FOR MANUFACTURING THE SAME

This application is a DIV of Ser. No. 14/457,119 filed on Aug. 12, 2014, now U.S. Pat. No. 9,236,289.

FIELD OF THE INVENTION

The present invention generally relates to a semiconductor manufacturing technology and, more particularly, to shallow trench isolation structures in a semiconductor device and a method for manufacturing the shallow trench isolation structures.

BACKGROUND OF THE INVENTION

The integrated circuit (IC) manufacturing technology have been moving forward as the metal-oxide-semiconductor field-effect transistors (MOSFETs) become smaller and smaller to improve the performances such as increased switching speed, lowered power consumption and higher level of integration. In view of device isolation, shallow trench isolation (STI) technology has advantages over the conventional local oxidation of silicon (LOCOS) technology. For example, STI technology shrinks the surface area needed to isolate transistors while offering superior latch-up immunity, smaller channel-width encroachment and better planarity.

However, STI technology encounters many challenges. For example, chemical-mechanical polishing (CMP) with different pattern densities may result in over-polishing to cause dishing in the trench in the low pattern density region. As a result, open circuits occur due to collapse or breaks in the metal interconnects.

To overcome the problems due to dishing with STI technology, U.S. Pat. No. 6,372,605 provides a method using an additional oxide-reduction etching step performed prior to chemical-mechanical processing so as to reduce the polishing time to prevent dishing for shallow trench isolation processing.

In the present invention, provided are shallow trench isolation structures in a semiconductor device and a method for manufacturing the shallow trench isolation structures by depositing a high-k material layer in a trench with a larger surface area to improve surface planarity of the semiconductor device.

SUMMARY OF THE INVENTION

It is one objective of the present invention to provide shallow trench isolation structures in a semiconductor device and a method for manufacturing the shallow trench isolation structures by depositing a high-k material layer in a trench with a larger surface area to improve surface planarity of the semiconductor device.

It is another objective of the present invention to provide shallow trench isolation structures in a semiconductor device and a method for manufacturing the shallow trench isolation structures by depositing a high-k material layer in a trench with a larger surface area to reduce eddy currents in the semiconductor device.

It is another objective of the present invention to provide shallow trench isolation structures in a semiconductor device and a method for manufacturing the shallow trench isolation structures by depositing a high-k material layer in a trench with a larger surface area to enhance high-frequency performance of the semiconductor device.

In order to achieve the foregoing objectives, in one embodiment, the present invention provides a method for manufacturing shallow trench isolation structures in a semiconductor device, comprising steps of: providing a substrate with a pad oxide layer and a first patterned photoresist layer in sequence thereon; forming a first trench in the substrate corresponding to the first patterned photoresist layer; depositing a first dielectric layer in the first trench and on the substrate after removing the first patterned photoresist layer; providing a second patterned photoresist layer to form an opening in the first dielectric layer and a second trench in the substrate corresponding to the second patterned photoresist layer; depositing a second dielectric layer covering the first dielectric layer in the first trench and the second trench in the substrate and the first dielectric layer on the substrate after removing the second patterned photoresist layer; removing the second dielectric layer by chemical-mechanical polishing until the first dielectric layer is exposed; and selectively removing the first dielectric layer on the substrate; wherein the first trench has a larger surface area than the second trench and the first dielectric layer has a higher dielectric constant than the second dielectric layer.

In order to achieve the foregoing objective, in another embodiment, the present invention provides a method for manufacturing shallow trench isolation structures in a semiconductor device, comprising steps of: providing a substrate with a pad oxide layer and a first patterned photoresist layer in sequence thereon; forming a first trench and a second trench in the substrate corresponding to the first patterned photoresist layer; depositing a first dielectric layer in the first trench and the second trench and on the substrate after removing the first patterned photoresist layer; depositing a second dielectric layer covering the first dielectric layer in the first trench and the second trench in the substrate and the first dielectric layer on the substrate; removing the second dielectric layer by chemical-mechanical polishing until the first dielectric layer is exposed; and selectively removing the first dielectric layer on the substrate; wherein the first trench has a larger surface area than the second trench and the first dielectric layer has a higher dielectric constant than the second dielectric layer.

In order to achieve the foregoing objectives, in another embodiment, the present invention provides a semiconductor device with shallow trench isolation structures, comprising: a semiconductor substrate with a first trench isolation structure and a second trench isolation structure; wherein the first trench isolation structure comprises a first dielectric layer and a second dielectric layer, and the second trench isolation structure comprises at least one second dielectric layer; wherein the first trench isolation structure has a larger surface area than the second trench isolation structure, and the first dielectric layer has a higher dielectric constant than the second dielectric layer.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
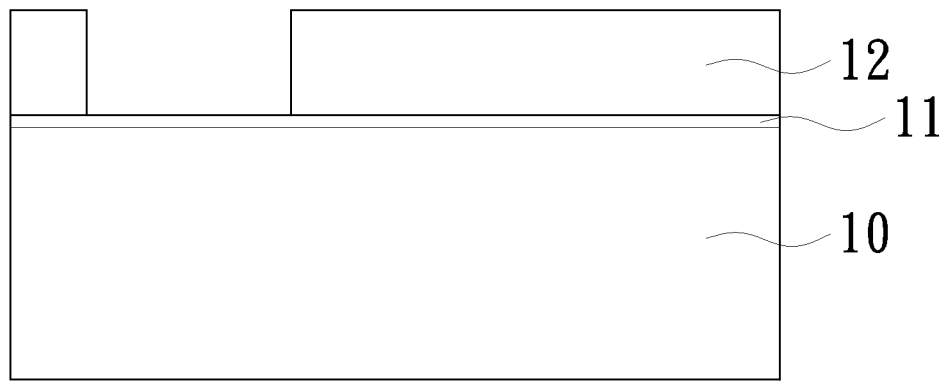
FIG. 1A to FIG. 1G are cross-sectional views showing the steps for manufacturing shallow trench isolation structures according to one embodiment of the present invention.

Please refer to FIG. 1A to FIG. 1G for cross-sectional views showing the steps for manufacturing shallow trench isolation structures according to one embodiment of the present invention. As shown in FIG. 1A, a substrate 10 is provided with a pad oxide layer 11 and a first patterned photoresist layer 12 formed in sequence on the substrate 10. In the present embodiment, the substrate 10 can be a silicon substrate, a III-V semiconductor substrate, a sapphire substrate, a silicon on insulator (SOI) substrate, or any other substrates with electronic components thereon. In the present embodiment, the pad oxide 11 is formed by thermal oxidation or deposition.

Figure 1B:
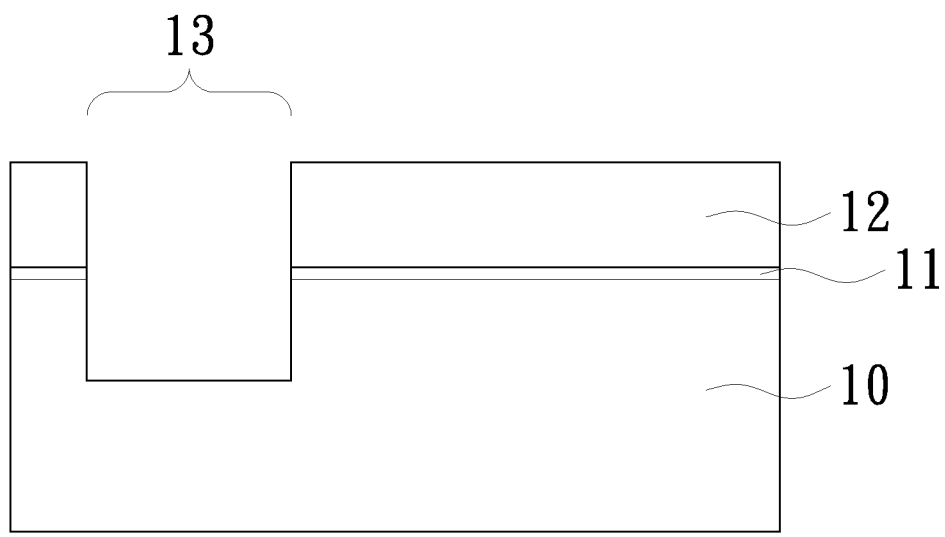

Then, as shown in FIG. 1B, a first trench 13 is formed by etching in the substrate 10 corresponding to the first patterned photoresist layer 12. In the present embodiment, the first trench 13 has a surface area preferably larger than 10000 µm² and a depth preferably of about 200 to 300 nm.

Figure 1C:
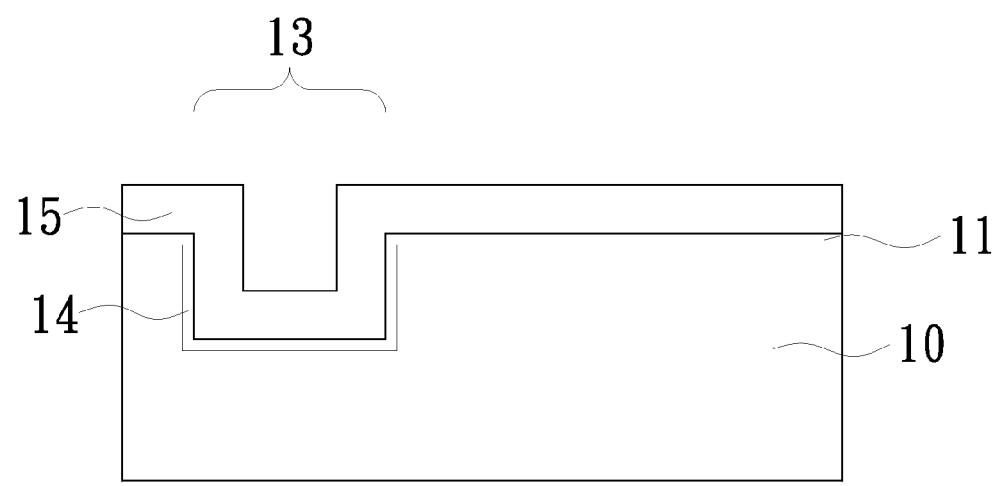

After the first patterned photoresist layer 12 is removed, a liner layer 14 is formed in the first trench 13 and then a first dielectric layer 15 is deposited to cover the liner layer 14 in the first trench 13 and the pad oxide 11 on the substrate 10, as shown FIG. 1C. In the present embodiment, the liner layer 14 is an oxide formed by thermal oxidation or an oxide, a nitride or an oxynitride formed by deposition. In the present embodiment, the first dielectric layer 15 is silicon nitride or any other high-k material with a dielectric constant higher than silicon dioxide.

Figure 1D:
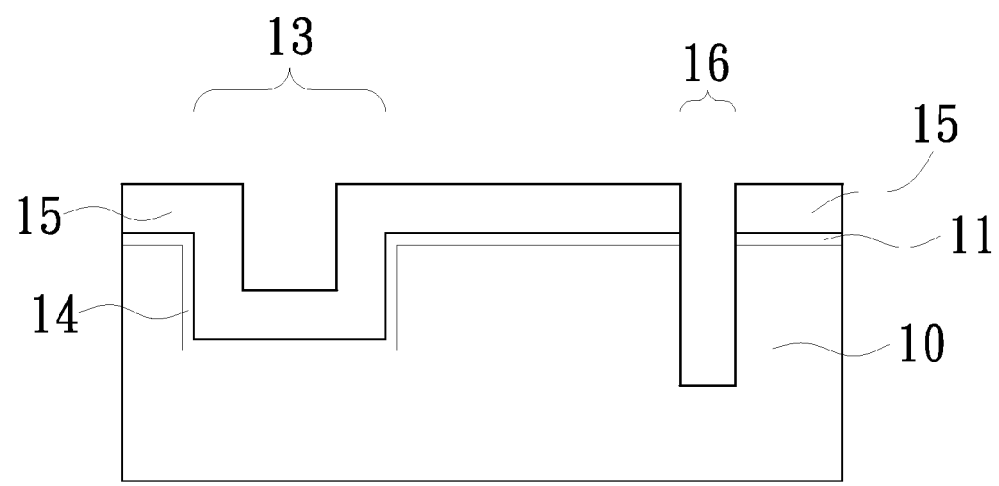

Next, a second patterned photoresist layer (not shown) is provided to form an opening in the first dielectric layer 15 and to form a second trench 16 in the substrate 10 corresponding to the second patterned photoresist layer, as shown in FIG. 1D. In the present embodiment, the second trench 16 has a surface area smaller than that of the first trench 13, and a depth preferably of about 300 to 500 nm.

Figure 1E:
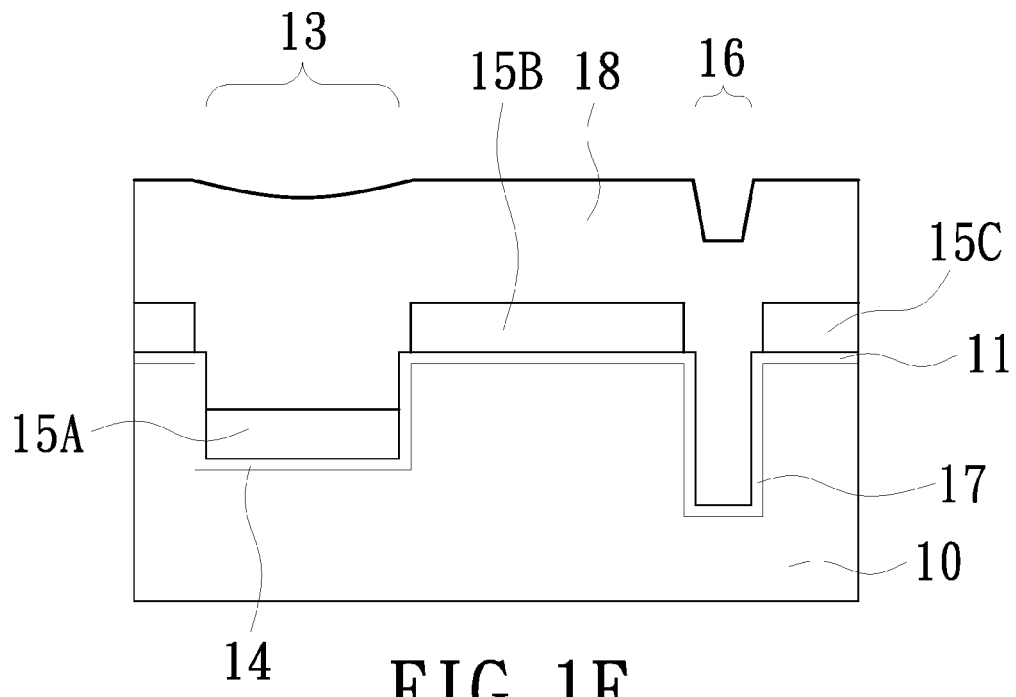

After the second patterned photoresist layer (not shown) is removed, a pull-back step is performed to remove a portion of the first dielectric layer 15 by etching, so as to expose top-edge portions of the pad oxide layer 11 in the first trench 13 and in the second trench 16. After the pull-back step is performed, the (remaining) first dielectric layer 15 includes a plurality of first dielectric layer portions 15A, 15B, and 15C. To be more precise, the first dielectric layer portion 15A may also be referred to as the first dielectric layer sub-portion 15A. The first dielectric layer sub-potion 15A is exposed in the first trench 13 after the pull-back step (not shown in figures). Then, a liner layer 17 is formed in the second trench 16, followed by the deposition of a second dielectric layer 18 covering the first dielectric layer portion 15A disposed in the first trench 13 in the substrate 10, the first dielectric layer portion 15C and the first dielectric layer portion 15B disposed above the substrate 10, as shown in FIG. 1E. In the present embodiment, the liner layer 17 is an oxide formed by thermal oxidation or an oxide, a nitride or an oxynitride formed by deposition. In the present embodiment, the second dielectric layer 18 is preferably silicon dioxide formed by deposition.

Figure 1F:
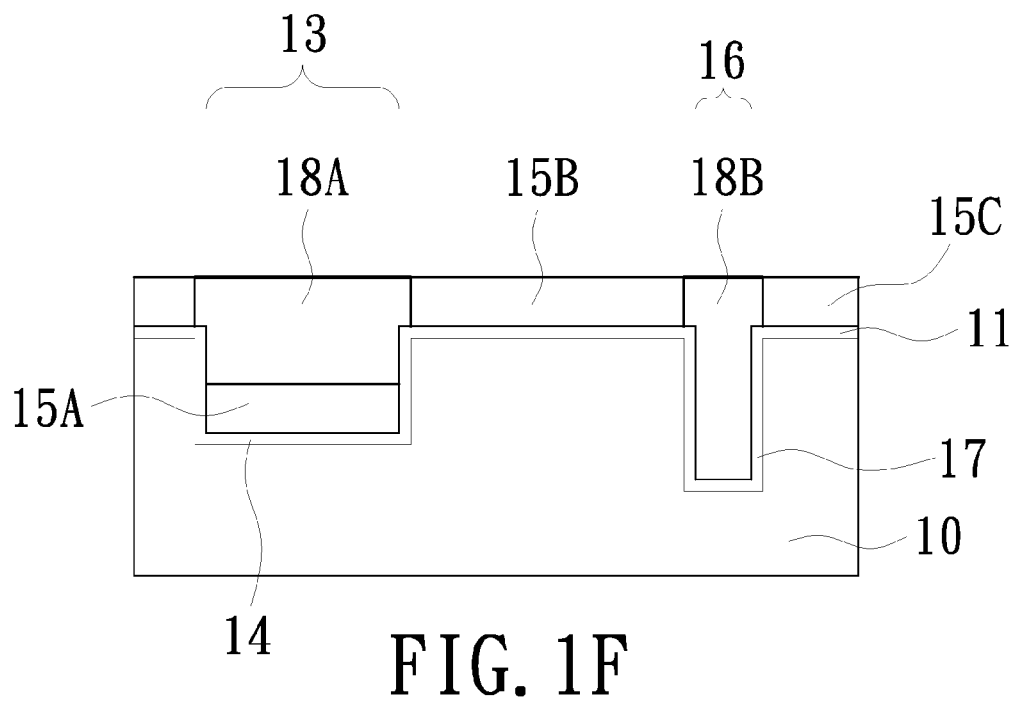

Next, a chemical-mechanical polishing (CMP) process is performed to remove the second dielectric layer 18 until the first dielectric layer portions 15B and 15C are exposed, as shown FIG. 1F.

Figure 1G:
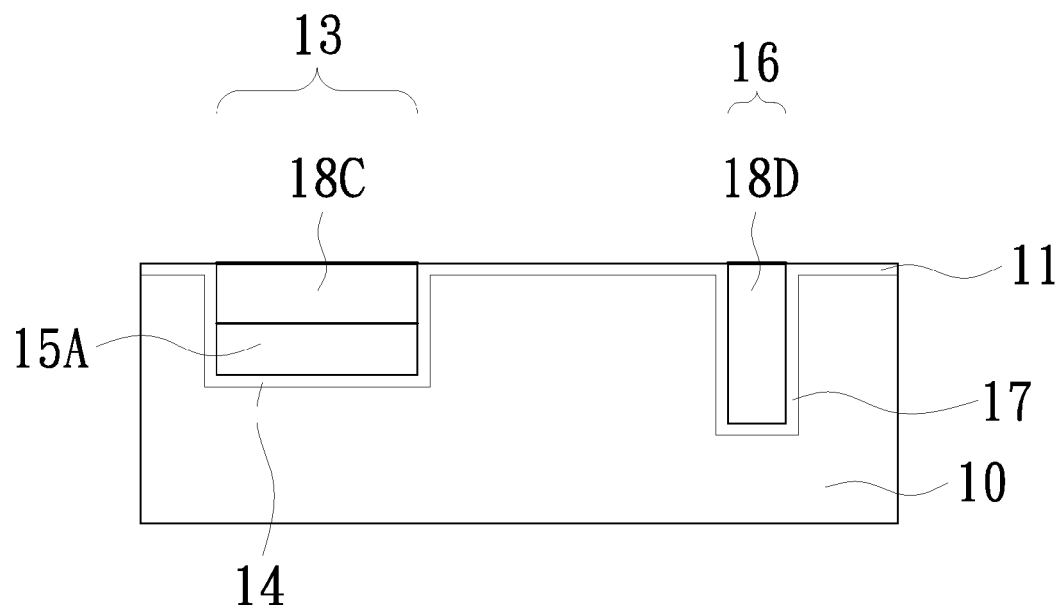

As shown in FIG. 1F, the (remaining) second dielectric layer 18 includes a plurality of second dielectric layer portions 18A and 18B. At last, a selective etching process is performed to remove a portion of the second dielectric layer portions 18A and 18B and the first dielectric layer portions 15B and 15C, as shown FIG. 1G. In the present embodiment, the first trench 13 has a surface area larger than that of the second trench 16. The first trench 13 comprises the first dielectric layer portion 15A and a second dielectric layer portion 18C, while the second trench 16 comprises a second dielectric layer portion 18D. As shown in FIG. 1G, the remaining portions of the second dielectric layer portions 18A, 18B form the second dielectric layer portions 18C and 18D, respectively. In the illustrated embodiments, the first dielectric layer portions 15B, 15C can be referred also to as an another first dielectric layer portion, respectively, and the second dielectric layer portions 18B, 18D can be referred also to as an another second dielectric layer portion, respectively.

Accordingly, by the use of the method described from FIG. 1A to FIG. 1G, a semiconductor device with shallow trench isolation structures is manufactured, as shown in FIG. 1G. The semiconductor device comprises: a semiconductor substrate 10 with a first trench isolation structure 13 and a second trench isolation structure 16. The first trench isolation structure 13 comprises the first dielectric layer portion 15A and the second dielectric layer portion 18C. The second trench isolation structure 16 comprises the second dielectric layer portion 18D. In the present embodiment, the first trench isolation structure 13 has a surface area larger than that of the second trench isolation structure 16, and the first dielectric layer portion 15A has a dielectric constant higher than the second dielectric layer portion 18C.

With of realization of the present invention, dishing in the trench due to over-polishing can be prevented so as to improve the surface planarity of the semiconductor device and prevented the metal interconnects from collapse or breaks. Moreover, since the high-k first dielectric layer portion 15A is deposited in the first trench isolation structure 13 having a larger surface area, a large-area inductor formed on the first trench isolation structure 13 may exhibit lowered eddy currents to prevent the semiconductor device from thermal issues. Furthermore, the high-k first dielectric layer portion 15A deposited in the first trench isolation structure 13 also reduces noise and enhance high-frequency performances in the semiconductor device.

Figure 2A:
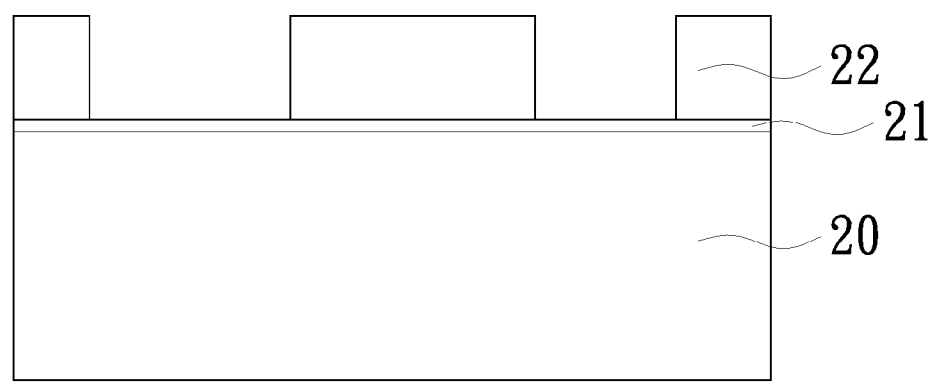
FIG. 2A to FIG. 2G are cross-sectional views showing the steps for manufacturing shallow trench isolation structures according to another embodiment of the present invention.

FIG. 2A to FIG. 2G are cross-sectional views showing the steps for manufacturing shallow trench isolation structures according to another embodiment of the present invention. As shown in FIG. 2A, a substrate 20 is provided with a pad oxide layer 21 and a first patterned photoresist layer 22 formed in sequence on the substrate 20. In the present embodiment, the substrate 20 can be a silicon substrate, a III-V semiconductor substrate, a sapphire substrate, a silicon on insulator (SOI) substrate, or any other substrates with electronic components thereon. In the present embodiment, the pad oxide 21 is formed by thermal oxidation or deposition.

Figure 2B:
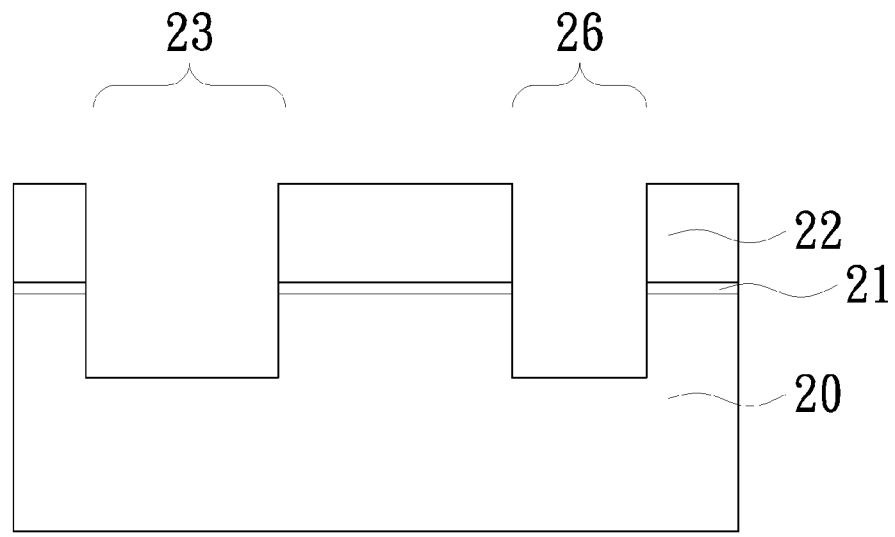

Then, as shown in FIG. 2B, a first trench 23 and a second trench 26 are formed by etching in the substrate 20 corresponding to the first patterned photoresist layer 22. In the present embodiment, the first trench 23 has a surface area preferably larger than 10000 μm² and a depth preferably of about 200 to 500 nm.

Figure 2C:
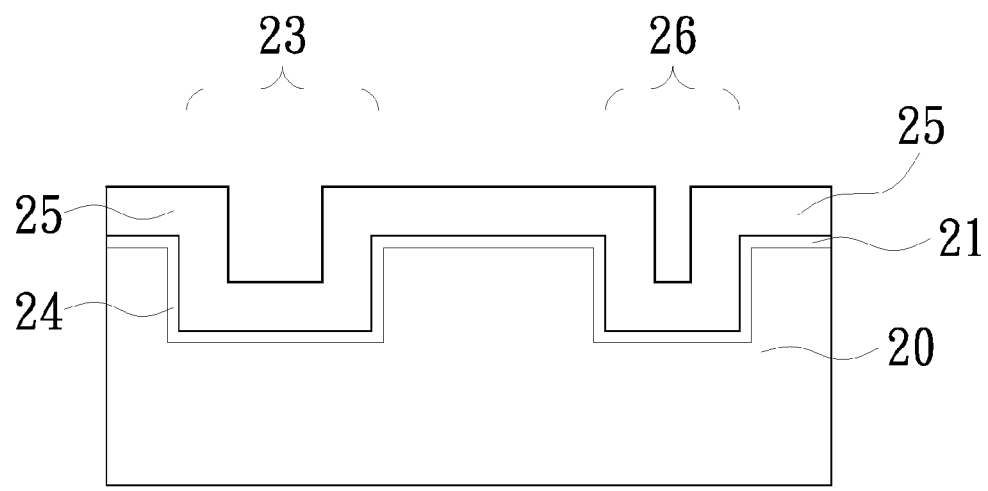

After the first patterned photoresist layer 22 is removed, a liner layer 24 is formed in the first trench 23 and the second trench 26 and then a first dielectric layer 25 is deposited to cover the liner layer 24 in the first trench 23 and in the second trench 26 and the pad oxide 21 on the substrate 20, as shown FIG. 2C. In the present embodiment, the liner layer 24 is an oxide formed by thermal oxidation or an oxide, a nitride or an oxynitride formed by deposition. In the present embodiment, the first dielectric layer 25 is silicon nitride or any other high-k material with a dielectric constant higher than silicon dioxide.

Figure 2D:
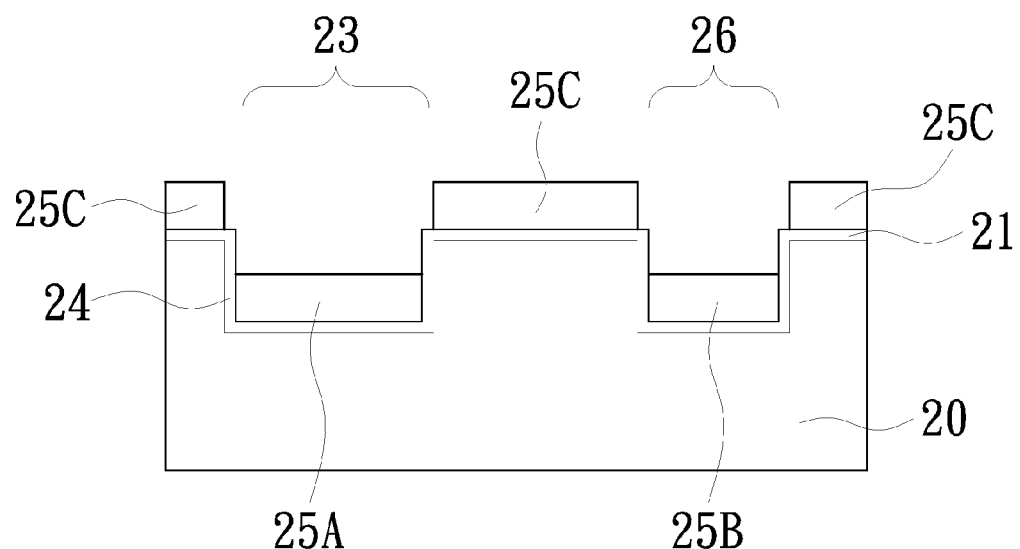

Next, a pull-back step is performed to remove a portion of the first dielectric layer 25 by etching, so as to expose top-edge portions of the pad oxide 21 in the first trench 23 and in the second trench 26, as shown in FIG. 2D. After the pull-back step is performed, the (remaining) first dielectric layer 25 includes a plurality of first dielectric layer portions 25A, 25B, and 25C. To be more precise, the first dielectric layer portion 25A may also be referred to as the first dielectric layer sub-portion 25A. The first dielectric layer sub-potion 25A is exposed in the first trench 23 after the pull-back step, as shown in FIG. 2D.

Figure 2E:
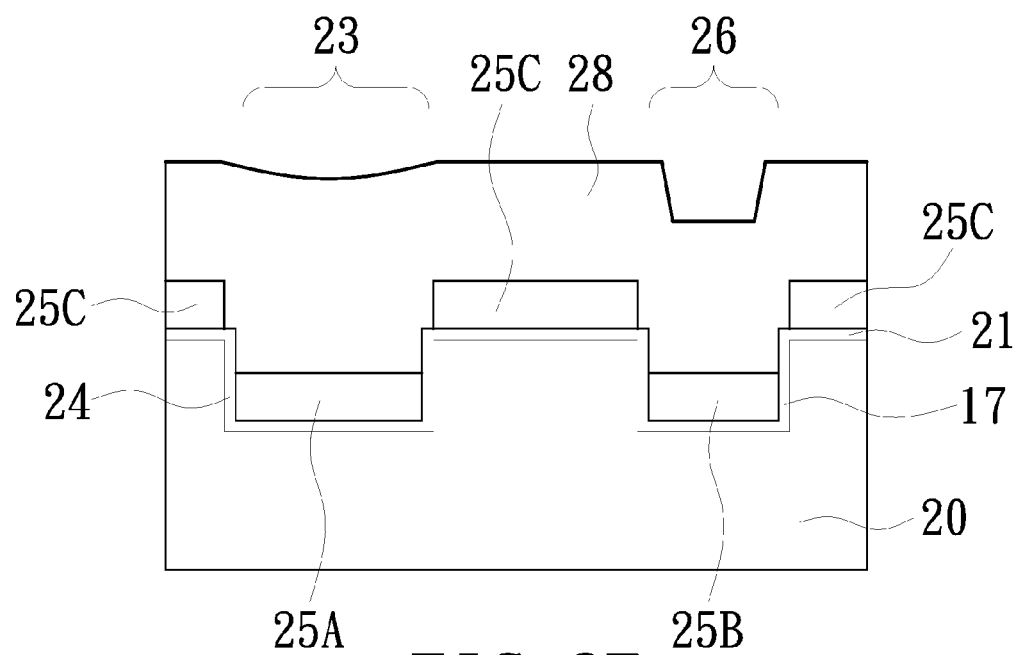

Then, a second dielectric layer 28 is deposited to cover the first dielectric layer portion 25A in the first trench 23, the first dielectric layer portion 25B in the second trench 26 in the substrate 20 and the first dielectric layer portion 25C on the substrate 20, as shown in FIG. 2E. In the present embodiment, the second dielectric layer 28 is preferably silicon dioxide formed by deposition.

Figure 2F:
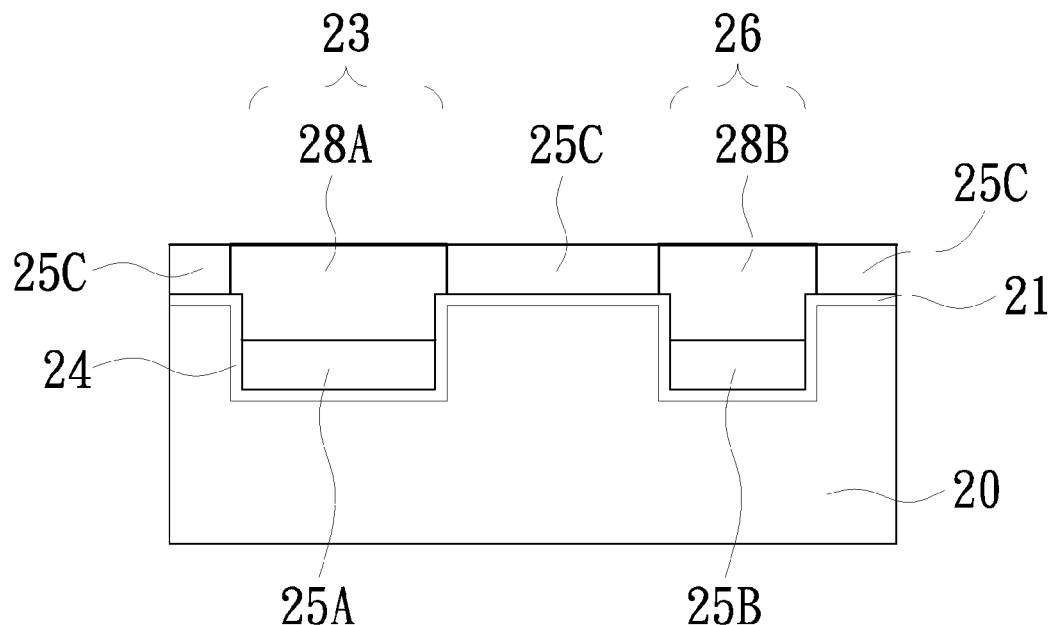

Next, a chemical-mechanical polishing (CMP) process is performed to remove the second dielectric layer 28 until the first dielectric layer portion 25C is exposed, as shown FIG. 2F.

Figure 2G:
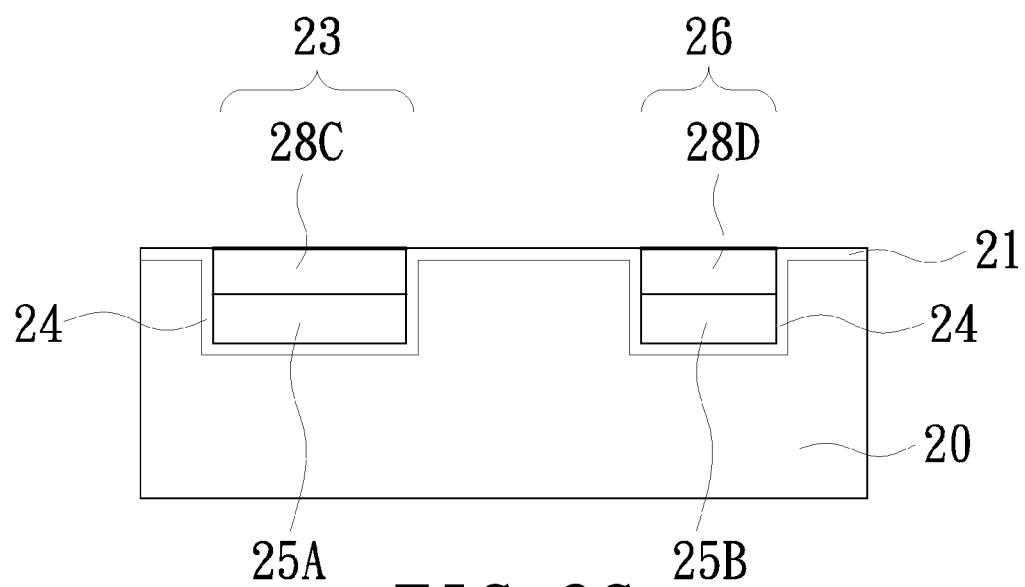

At last, a selective etching process is performed to remove the second dielectric layer portions 28A and 28B and the first dielectric layer portion 25C, as shown FIG. 2G. In the present embodiment, the first trench 23 has a surface area larger than the second trench 26. The first trench 23 comprises the first dielectric layer portion 25A and the second dielectric layer portion 28C, while the second trench 26 comprises the first dielectric layer portion 25B and the second dielectric layer portion 28D.

Accordingly, by the use of the method described from FIG. 2A to FIG. 2G, a semiconductor device with shallow trench isolation structures is manufactured, as shown in FIG. 2G. The semiconductor device comprises: a semiconductor substrate 20 with a first trench isolation structure 23 and a second trench isolation structure 26. The first trench isolation structure 23 comprises a first dielectric layer portion 25A and a second dielectric layer portion 28C. The second trench isolation structure 26 comprises a first dielectric layer portion 25B and a second dielectric layer portion 28D. In the present embodiment, the first trench isolation structure 23 has a surface area larger than the second trench isolation structure 26, and the first dielectric layer portion 25A has a dielectric constant higher than the second dielectric layer portion 28C.

With of realization of the present invention, dishing in the trench due to over-polishing can be prevented so as to improve the surface planarity of the semiconductor device and prevented the metal interconnects from collapse or breaks. Moreover, since a high-k first dielectric layer portion 25A is deposited in the first trench isolation structure 23 having a larger surface area, a large-area inductor formed on the first trench isolation structure 23 may exhibit lowered eddy currents to prevent the semiconductor device from thermal issues. Furthermore, the high-k first dielectric layer portion 25A deposited in the first trench isolation structure 23 also reduces noise and enhance high-frequency performances in the semiconductor device.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing shallow trench isolation structures in a semiconductor device, comprising steps of:
   providing a substrate with a pad oxide layer and a first patterned photoresist layer in sequence thereon;
   forming a first trench in said substrate corresponding to said first patterned photoresist layer;
   depositing a first dielectric layer in said first trench and on said substrate, respectively, after removing said first patterned photoresist layer;
   providing a second patterned photoresist layer to form an opening in said first dielectric layer and to form a second trench in said substrate corresponding to said second patterned photoresist layer;
   removing said second pattern photoresist layer and a portion of said first dielectric layer so as to expose a first dielectric layer sub-portion in said first trench;
   depositing a second dielectric layer covering the first dielectric layer sub-portion in said first trench and said first dielectric layer in said second trench and on said substrate;
   removing said second dielectric layer by chemical-mechanical polishing until said first dielectric layer is exposed; and
   selectively removing said first dielectric layer on said substrate;
   wherein said first trench has a larger surface area than said second trench and said first dielectric layer has a higher dielectric constant than said second dielectric layer.

2. The method of claim 1, further comprising a step of: forming a liner layer in said first trench prior to depositing said first dielectric layer.

3. The method of claim 1, further comprising a step of forming a liner layer in said second trench prior to depositing said second dielectric layer.

4. The method of claim 3, further comprising a step of performing a pull-back step to remove portions of said first dielectric layer so as to expose top-edge portions of said pad oxide in said first trench and said second trench prior to forming said liner layer in said second trench.

5. The method of claim 1, wherein said first trench has a surface area larger than 10000 μm².

6. The method of claim 1, wherein said first trench has a depth of about 200 to 300 nm, and said second trench has a depth of about 300 to 500 nm.

7. A method for manufacturing shallow trench isolation structures in a semiconductor device, comprising steps of:
   providing a substrate with a pad oxide layer and a first patterned photoresist layer in sequence thereon;
   forming a first trench and a second trench in said substrate corresponding to said first patterned photoresist layer;

depositing a first dielectric layer in said first trench and said second trench and on said substrate after removing said first patterned photoresist layer;

removing a portion of said first dielectric layer so as to expose first dielectric layer sub-portions in said first trench and in said second trench;

depositing a second dielectric layer covering said first dielectric layer sub-portions in said first trench and in said second trench and said first dielectric layer on said substrate;

removing said second dielectric layer by chemical-mechanical polishing until said first dielectric layer on said substrate is exposed; and selectively removing said first dielectric layer on said substrate;

wherein said first trench has a larger surface area than said second trench and said first dielectric layer has a higher dielectric constant than said second dielectric layer.

8. The method of claim 7, further comprising a step of: forming a liner layer in said first trench and said second trench prior to depositing said first dielectric layer.

9. The method of claim 7, further comprising a step of performing a pull-back step to remove portions of said first dielectric layer so as to expose top-edge portions of said pad oxide in said first trench and said second trench prior to forming said second dielectric layer.

10. The method of claim 7, wherein said first trench has a surface area larger than 10000 $\mu m^2$.

11. The method of claim 7, wherein each of said first trench and said second trench has a depth of about 200 to 500 nm.

\* \* \* \* \*